US012742240B2

(12) United States Patent
Lim et al.

(10) Patent No.: US 12,742,240 B2
(45) Date of Patent: Sep. 22, 2026

(54) SEMICONDUCTOR MANUFACTURING APPARATUS, GAS SUPPLYING METHOD USING THE SAME, AND SEMICONDUCTOR MANUFACTURING METHOD USING THE SAME

(71) Applicant: SAMSUNG ELECTRONICS CO., LTD., Suwon-si (KR)

(72) Inventors: Chan Kyu Lim, Suwon-si (KR); Yoonbon Koo, Suwon-si (KR); Hanhim Kang, Suwon-si (KR); Suji Gim, Suwon-si (KR); Jongkoo Lim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 459 days.

(21) Appl. No.: 18/227,467

(22) Filed: Jul. 28, 2023

(65) Prior Publication Data

US 2024/0124979 A1 Apr. 18, 2024

(30) Foreign Application Priority Data

Sep. 27, 2022 (KR) ........................ 10-2022-0122031

(51) Int. Cl.

| | |
|---|---|
| ***C23C 16/455*** | (2006.01) |
| ***C23C 16/52*** | (2006.01) |
| ***H10B 41/27*** | (2023.01) |
| ***H10B 43/27*** | (2023.01) |

(52) U.S. Cl.

CPC ........ *C23C 16/45561* (2013.01); *C23C 16/52* (2013.01); *H10B 41/27* (2023.02); *H10B 43/27* (2023.02)

(58) Field of Classification Search

None

See application file for complete search history.

(56) References Cited

U.S. PATENT DOCUMENTS

| | | | |
|---|---|---|---|
| 6,153,260 | A | 11/2000 | Comita et al. |
| 10,208,401 | B2 | 2/2019 | Park et al. |
| 11,220,748 | B2 | 1/2022 | Han et al. |

(Continued)

FOREIGN PATENT DOCUMENTS

| | | | |
|---|---|---|---|
| JP | 2009-135157 | A | 6/2009 |
| JP | 2013-51374 | A | 3/2013 |
| KR | 10-0528030 | B1 | 11/2005 |

*Primary Examiner* — Sarah K Salerno

(74) *Attorney, Agent, or Firm* — Sughrue Mion, PLLC

(57) ABSTRACT

The present disclosure provides methods and apparatuses for supplying a process gas in a semiconductor manufacturing process. In some embodiments, the method includes heating, using one or more heating devices of the semiconductor manufacturing apparatus, a gas tank and a gas line of the semiconductor manufacturing apparatus. The method further includes filling, through the gas line, the gas tank with a reaction gas. The method further includes changing, using the one or more heating devices, a temperature of the reaction gas in the gas tank. The method further includes supplying the reaction gas from the gas tank to a process chamber of the semiconductor manufacturing apparatus. The changing of the temperature of the reaction gas includes decomposing a portion of the reaction gas into one or more materials different from the reaction gas.

14 Claims, 10 Drawing Sheets

(56) References Cited

U.S. PATENT DOCUMENTS

2005/0069632 A1* 3/2005 Yamasaki ......... C23C 16/45523
257/E21.585
2013/0122220 A1* 5/2013 Won ...................... C01B 32/184
118/724
2013/0344247 A1 12/2013 Ueyama et al.
2024/0122076 A1* 4/2024 Reznicek ............... H10N 50/10

* cited by examiner

SEMICONDUCTOR MANUFACTURING APPARATUS, GAS SUPPLYING METHOD USING THE SAME, AND SEMICONDUCTOR MANUFACTURING METHOD USING THE SAME

CROSS-REFERENCE TO RELATED APPLICATIONS

This application claims benefit of priority under 35 U.S.C. § 119 to Korean Patent Application No. 10-2022-0122031, filed on Sep. 27, 2022, in the Korean Intellectual Property Office, the disclosure of which is incorporated by reference herein in its entirety.

BACKGROUND

1. Field

The present disclosure relates generally to a semiconductor manufacturing apparatus, and more particularly, to a semiconductor manufacturing apparatus, which is configured to heat a reaction gas in a gas tank and a gas line, a method of supplying a process gas using the same in a semiconductor manufacturing process, and a method of manufacturing a semiconductor device using the same.

2. Description of Related Art

A related semiconductor device capable of storing a large amount of data may be required as a data storage device of an electronic system. As consumer demands for large data storing capacity, superior performance, and inexpensive prices increase, higher integration of related semiconductor devices may be required to satisfy those consumer demands. For example, in a case of two-dimensional and/or planar related semiconductor devices, integration may be influenced by a level of a fine pattern forming technology, since their integration is may be determined by an area occupied by a unit memory cell of the related semiconductor devices. However, the level of the fine pattern forming technology may be constrained by the cost of process equipment needed to increase pattern fineness. That is, the cost of process equipment may set a practical limitation on increasing integration for two-dimensional and/or planar related semiconductor devices. As a result, three-dimensional semiconductor memory devices, including three-dimensionally arranged memory cells, have been proposed.

SUMMARY

Aspects of the present disclosure provide a semiconductor manufacturing apparatus, which may be configured to heat a reaction gas in a gas tank and a gas line, a method of supplying a process gas using the same in a semiconductor manufacturing process, and a method of manufacturing a semiconductor device using.

According to an aspect of the present disclosure, a method of supplying a process gas in a semiconductor manufacturing process by a semiconductor manufacturing apparatus is provided. The method includes heating, using one or more heating devices of the semiconductor manufacturing apparatus, a gas tank and a gas line of the semiconductor manufacturing apparatus. The method further includes filling, through the gas line, the gas tank with a reaction gas. The method further includes changing, using the one or more heating devices, a temperature of the reaction gas in the gas tank. The method further includes supplying the reaction gas from the gas tank to a process chamber of the semiconductor manufacturing apparatus. The changing of the temperature of the reaction gas includes decomposing a portion of the reaction gas into one or more materials different from the reaction gas.

According to an aspect of the present disclosure, a method of manufacturing a semiconductor device by a semiconductor manufacturing apparatus is provided. The method includes heating, using one or more heating devices of the semiconductor manufacturing apparatus, a gas tank and a gas line of the semiconductor manufacturing apparatus;

fastening a substrate to a substrate fastening device of a process chamber of the semiconductor manufacturing apparatus. The method further includes supplying a reaction gas to the process chamber. The method further includes performing a semiconductor manufacturing process in the process chamber. The supplying of the reaction gas includes filling, through the gas line, the gas tank with the reaction gas, changing, using the one or more heating devices, a temperature of the reaction gas in the gas tank, and supplying the reaction gas from the gas tank to the process chamber. A first time length for the filling of the gas tank with the reaction gas exceeds a second time length for the supplying of the reaction gas to the process chamber.

According to an aspect of the present disclosure, a semiconductor manufacturing apparatus is provided. The semiconductor manufacturing apparatus includes a process chamber configured to perform a semiconductor manufacturing process, a first gas line configured to provide a reaction gas, a gas tank coupled with the first gas line and includes a measurement device, a second gas line coupling the process chamber with the gas tank, a gas valve on the second gas line, a heating device provided to enclose at least a portion of each of the gas tank, the first gas line, and the second gas line, a temperature control device coupled with the heating device, and a valve control device coupled with the measurement device and the gas valve. The temperature control device is configured to receive heating information from the heating device, and control the heating device based on the heating information. The valve control device is configured to receive measurement information from the measurement device, and control the gas valve based on the measurement information.

Additional aspects will be set forth in part in the description which follows and, in part, will be apparent from the description, or may be learned by practice of the presented embodiments.

BRIEF DESCRIPTION OF DRAWINGS

The above and other aspects, features, and advantages of certain embodiments of the present disclosure will be more apparent from the following description taken in conjunction with the accompanying drawings, in which.

DETAILED DESCRIPTION

Figure 1:
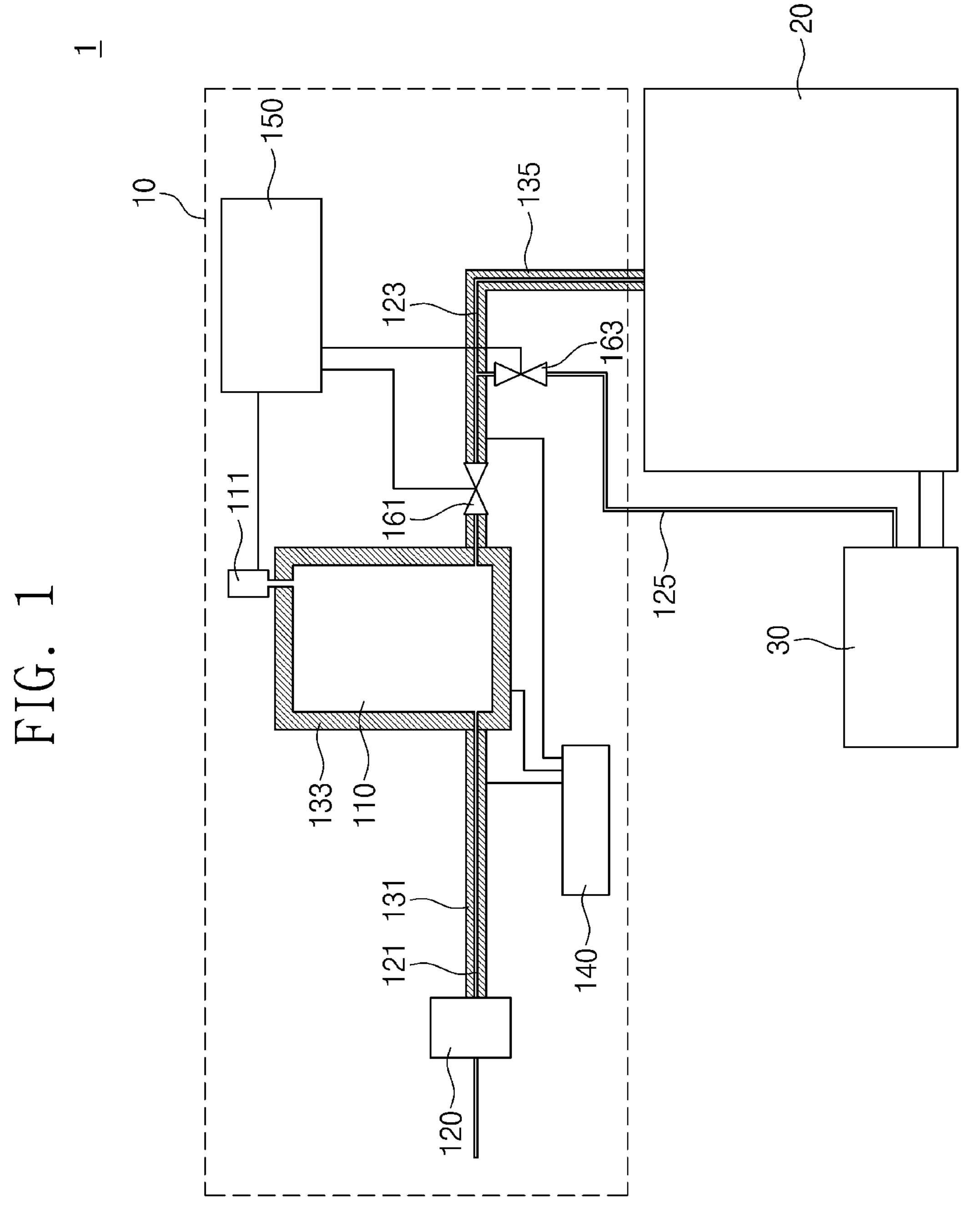
FIGS. 1 and 2 are conceptual diagrams, each of which illustrates a semiconductor manufacturing apparatus, according to an embodiment of the present disclosure.

The following description with reference to the accompanying drawings is provided to assist in a comprehensive understanding of embodiments of the present disclosure defined by the claims and their equivalents. Various specific details are included to assist in understanding, but these details are considered to be exemplary only. Therefore, those of ordinary skill in the art will recognize that various changes and modifications of the embodiments described herein can be made without departing from the scope and spirit of the disclosure. In addition, descriptions of well-known functions and structures are omitted for clarity and conciseness.

With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wired), wirelessly, or via a third element.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

The terms "upper," "middle", "lower", etc. may be replaced with terms, such as "first," "second," third" to be used to describe relative positions of elements. The terms "first," "second," third" may be used to described various elements but the elements are not limited by the terms and a "first element" may be referred to as a "second element". Alternatively or additionally, the terms "first", "second", "third", etc. may be used to distinguish components from each other and do not limit the present disclosure. For example, the terms "first", "second", "third", etc. may not necessarily involve an order or a numerical meaning of any form.

Reference throughout the present disclosure to "one embodiment," "an embodiment," "an example embodiment," or similar language may indicate that a particular feature, structure, or characteristic described in connection with the indicated embodiment is included in at least one embodiment of the present solution. Thus, the phrases "in one embodiment", "in an embodiment," "in an example embodiment," and similar language throughout this disclosure may, but do not necessarily, all refer to the same embodiment.

It is to be understood that the specific order or hierarchy of blocks in the processes/flowcharts disclosed are an illustration of exemplary approaches. Based upon design preferences, it is understood that the specific order or hierarchy of blocks in the processes/flowcharts may be rearranged. Further, some blocks may be combined or omitted. The accompanying claims present elements of the various blocks in a sample order, and are not meant to be limited to the specific order or hierarchy presented.

Example embodiments of the present disclosure are described below more fully with reference to the accompanying drawings, in which example embodiments are shown.

Figure 2:
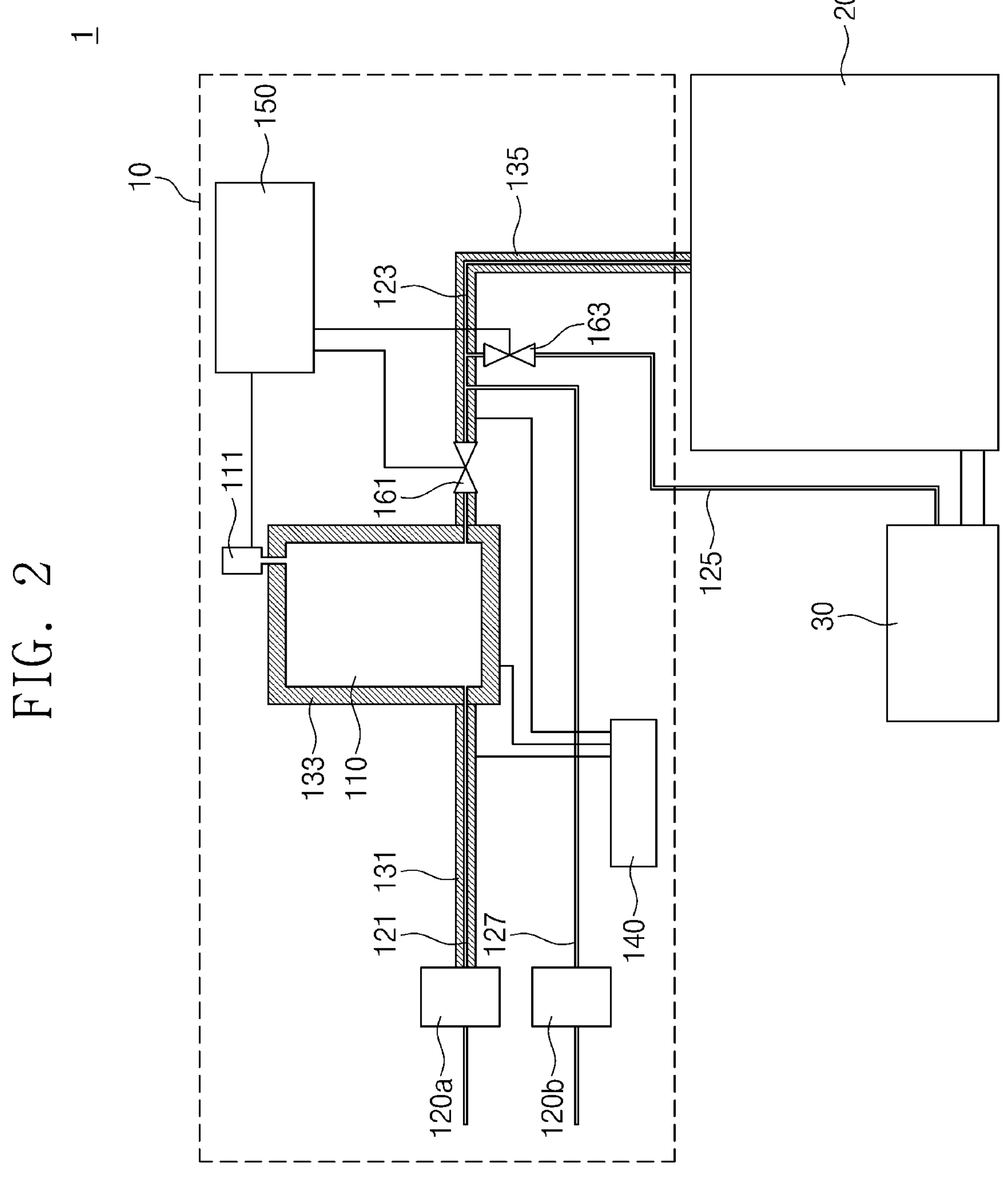

FIGS. 1 and 2 are conceptual diagrams, each of which illustrates a semiconductor manufacturing apparatus, according to an embodiment of the present disclosure.

Referring to FIG. 1, a semiconductor manufacturing apparatus 1 may be provided. The semiconductor manufacturing apparatus 1 may include a gas supplying part 10, a process chamber 20, an exhausting device 30, and a gas exhausting line 125. The gas supplying part 10, the process chamber 20, and the exhausting device 30 may be connected to each other.

The gas supplying part 10 may include a gas tank 110, first and second gas lines (e.g., first gas line 121 and second gas line 123), a flow control device 120, first to third heating devices (e.g., first heating device 131, second heating device 133, and third heating device 135), a temperature control device 140, and a valve control device 150.

The first gas line 121 may be disposed between the flow control device 120 and the gas tank 110. For example, the flow control device 120 may be connected to the gas tank 110 through the first gas line 121. The flow control device 120 may be configured to control an amount of a reaction gas flowing through the first gas line 121. In an embodiment, the flow control device 120 may include a mass flow controller (MFC). For example, the reaction gas may include, but not be limited to, at least one of diborane ($B_2H_6$), boron trichloride ($BCl_3$), silane ($SiH_4$), dichlorosilane ($SiH_2Cl_2$ or DCS), and hydrogen ($H_2$). As used herein, each of the terms "$B_2H_6$", "$BCl_3$", "$SiH_4$", "$SiH_2Cl_2$", and "$H_2$", and the like may refer to a gas made of elements included in each of the terms and is not a chemical formula representing a stoichiometric relationship.

The gas tank 110 may be disposed between the first gas line 121 and the second gas line 123. For example, the gas tank 110 may be disposed between the flow control device 120 and the process chamber 20. The reaction gas may be supplied into the gas tank 110 through the first gas line 121 and may be drained from the gas tank 110 through the second gas line 123. The gas tank 110 may be configured to have an internal space in which the reaction gas is stored. In the internal space of the gas tank 110, the reaction gas may be compressed. That is, an internal pressure of the gas tank 110 may be higher (e.g., greater) than internal pressures of the first and second gas lines 121 and 123.

In an embodiment, a plurality of gas tanks (not shown) may be provided. For example, the plurality of gas tanks may be disposed in parallel. However, the present disclosure is not limited in this regard. For example, multiple quantities of gas tanks may be provided and/or the gas tanks may be disposed in various configurations. Each of the gas tanks may be filled with the reaction gas supplied through the first gas line 121. As a result of a large amount of the reaction gas being stored in the gas tanks, it may be possible to supply a large amount of the reaction gas to the process chamber 20 through a gas-supplying operation, when compared to a single gas tank as depicted in FIG. 1.

The gas tank 110 may include a measurement device 111. The measurement device 111 may be configured to measure a pressure and/or a temperature of the internal space of the gas tank 110. The measurement device 111 may include, but not be limited to, a pressure sensor and a temperature sensor. The measurement device 111 may be connected to the valve control device 150 to exchange electrical signals with the valve control device 150.

The semiconductor manufacturing apparatus 1 may include the first to third heating devices 131, 133, and 135, as described above. The first heating device 131 may be provided to enclose and/or cover at least a portion of the first gas line 121. The second heating device 133 may be provided to enclose and/or cover at least a portion of the gas tank 110. The third heating device 135 may be provided to enclose and/or at least a portion cover the second gas line 123. The first to third heating devices 131, 133, and 135 may be configured to heat the first and second gas lines 121 and 123 and the gas tank 110. The providing of heat by the first to third heating devices 131, 133, and 135 may lead to an increase in temperature of the reaction gases in the first and second gas lines 121 and 123 and the gas tank 110.

For example, at least one of the first to third heating devices 131, 133, and 135 may include a heating jacket with a heating line. In an embodiment, each of the first to third heating devices 131, 133, and 135 may include the heating line, a temperature sensor, and/or a thermal insulator. The thermal insulator may be configured to prevent a heat energy in the first and second gas lines 121 and 123 and the gas tank 110 from being leaked to the outside (e.g., outside of the first to third heating devices 131, 133, and 135, and/or outside of the semiconductor manufacturing apparatus 1).

In an embodiment, the first to third heating devices 131, 133, and 135 may be provided to constitute a single heating device. For example, the temperatures of the first and second gas lines 121 and 123 and the gas tank 110 may be controlled as a single heating device. That is, the temperatures of the first and second gas lines 121 and 123 and the gas tank 110 may be set to a substantially equal (e.g., same) temperature at an approximately same time (e.g., simultaneously). In an optional or additional embodiment, the third heating device 135 on the second gas line 123 may be configured to include only the thermal insulator, without the heating line and/or the temperature sensor.

The temperature control device 140 may be connected (e.g., coupled) to the first to third heating devices 131, 133, and 135 to exchange electrical signals with the first to third heating devices 131, 133, and 135. The temperature control device 140 may control the first to third heating devices 131, 133, and 135 such that each element enclosed thereby is within a desired temperature range. In an embodiment, the desired temperature range of the first and third heating devices 131 and 135 may be lower than the desired temperature range of the second heating device 133. That is, the gas tank 110 may be heated to a temperature that is higher (e.g., greater) than the first and second gas lines 121 and 123. Alternatively or additionally, in an embodiment, the desired temperature ranges of the first to third heating devices 131, 133, and 135 may be substantially equal to each other. For example, the desired temperature range of the first to third heating devices 131, 133, and 135 may range from approximately 100° C. to approximately 200° C.

In an embodiment, a first gas valve 161 may be further provided on the second gas line 123. The first gas valve 161 may be closer (e.g., nearer) to the gas tank 110 than to the process chamber 20. The first gas valve 161 may be used to block the reaction gas from flowing to the process chamber 20 from the gas tank 110. Alternatively or additionally, the first gas valve 161 may be connected (e.g., coupled) to the valve control device 150 to exchange electrical signals with the valve control device 150.

The valve control device 150 may be connected (e.g., coupled) to the measurement device 111 of the gas tank 110 and the first gas valve 161 to exchange electrical signals with the measurement device 111 of the gas tank 110 and the first gas valve 161. That is, the measurement device 111 may send information on the temperature and/or pressure of the gas tank 110 to the valve control device 150. If the temperature and/or pressure of the gas tank 110 reaches a specific temperature and/or pressure, the valve control device 150 may be configured to send an electrical signal to the first gas valve 161. For example, the first gas valve 161 may be opened and/or closed in response to the electrical signal sent from the valve control device 150. That is, the first gas valve 161 may be operated depending on the pressure and temperature of the gas tank 110. In an embodiment, the specific temperature and/or pressure may correspond to a predetermined value. Alternatively or additionally, the specific temperature and/or pressure may correspond to a value input (e.g., provided) by a user.

Alternatively or additionally, the valve control device 150 may control the first gas valve 161 in a time-dependent manner. In such an embodiment, the valve control device 150 may not be connected to the measurement device 111 of the gas tank 110. For example, the first gas valve 161 may be opened and/or closed during a specific time interval, regardless of the pressure and/or temperature of the gas tank 110.

The gas exhausting line 125 may connect the gas supplying part 10 to the exhausting device 30. For example, the gas exhausting line 125 may connect the second gas line 123, which is provided between the first gas valve 161 and the process chamber 20, to the exhausting device 30. The reaction gas in the second gas line 123 may be moved to the exhausting device 30 through the gas exhausting line 125. For example, in a process step in which the reaction gas is not supplied, the reaction gas, which may be left in the second gas line 123, may be removed through the gas exhausting line 125. Accordingly, the reaction gas may be supplied at a constant flow rate.

A second gas valve 163 may be placed on the gas exhausting line 125. The second gas valve 163 may be configured to prevent the reaction gas from moving to the exhausting device 30 through the gas exhausting line 125. The second gas valve 163 may be connected to the valve control device 150 to exchange electrical signals with the valve control device 150. For example, when a process is in a step of supplying the reaction gas to the process chamber 20, the first gas valve 161 may be opened and the second gas valve 163 may be closed. Alternatively or additionally, in another process step in which the reaction gas is not supplied to the process chamber 20, the first gas valve 161 may be closed and the second gas valve 163 may be opened. That is, the first and second gas valves 161 and 163 may be operated in an opposite manner.

The process chamber 20 may be connected to the gas supplying part 10. For example, the process chamber 20 may be connected to the second gas line 123, and the reaction gas may be supplied to the process chamber 20 through the second gas line 123. A semiconductor manufacturing process using the reaction gas may be performed in the process chamber 20. For example, the semiconductor manufacturing process may include, but not be limited to, a chemical vapor deposition (CVD) process and an atomic layer deposition (ALD) process.

The exhausting device 30 may be connected to the process chamber 20. A by-product and a remaining gas, which are produced and left in the process chamber 20, may be transferred to the exhausting device 30. That is, the exhausting device 30 may be configured to remove materials (e.g., gases) remaining in the process chamber 20 after a semiconductor manufacturing process has been performed. Alternatively or additionally, the exhausting device 30 may be used to maintain an inner space of the process chamber 20 in a low pressure state. For example, an internal pressure of the process chamber 20 may be about one (1) millitorr (e.g., mTorr) to one (1) Torr. In an embodiment, the exhausting device 30 may include a pump (not shown).

Referring to FIG. 2, the gas supplying part 10 may further include first and second flow control devices **120*a* and 120*b* and a third gas line 127. The first flow control device 120*a* may include or may be similar in many respects to the flow control device 120 of FIG. 1**, and may include additional features not mentioned above.

The second flow control device **120*b* may be connected to the third gas line 127. The second flow control device 120*b* may be configured to control an amount of a carrier gas flowing through the third gas line 127. In an embodiment, the second flow control device 120*b*** may include the MFC.

The third gas line 127 may be connected to the second gas line 123. That is, the reaction gas, which is supplied from the gas tank 110, and the carrier gas may be mixed with each other in the second gas line 123. Unlike the structure illustrated in FIG. 1, a mixture gas, in which the reaction gas and the carrier gas are mixed, may be supplied into the process chamber as depicted in FIG. 2. In an embodiment, the carrier gas may include, but not be limited to, argon (Ar) and/or nitrogen ($N_2$).

Each of FIGS. 1 and 2 illustrate an embodiment in which one gas supplying part 10 may be provided. However, the present disclosure is not limited in this regard. For example, the gas supplying part 10 may include first and second gas supplying parts, and the reaction gas may include first and second reaction gases. The first and second reaction gases may include different materials from each other. Alternatively or additionally, each of the first and second gas supplying parts may be connected to the process chamber 20.

Figure 3:
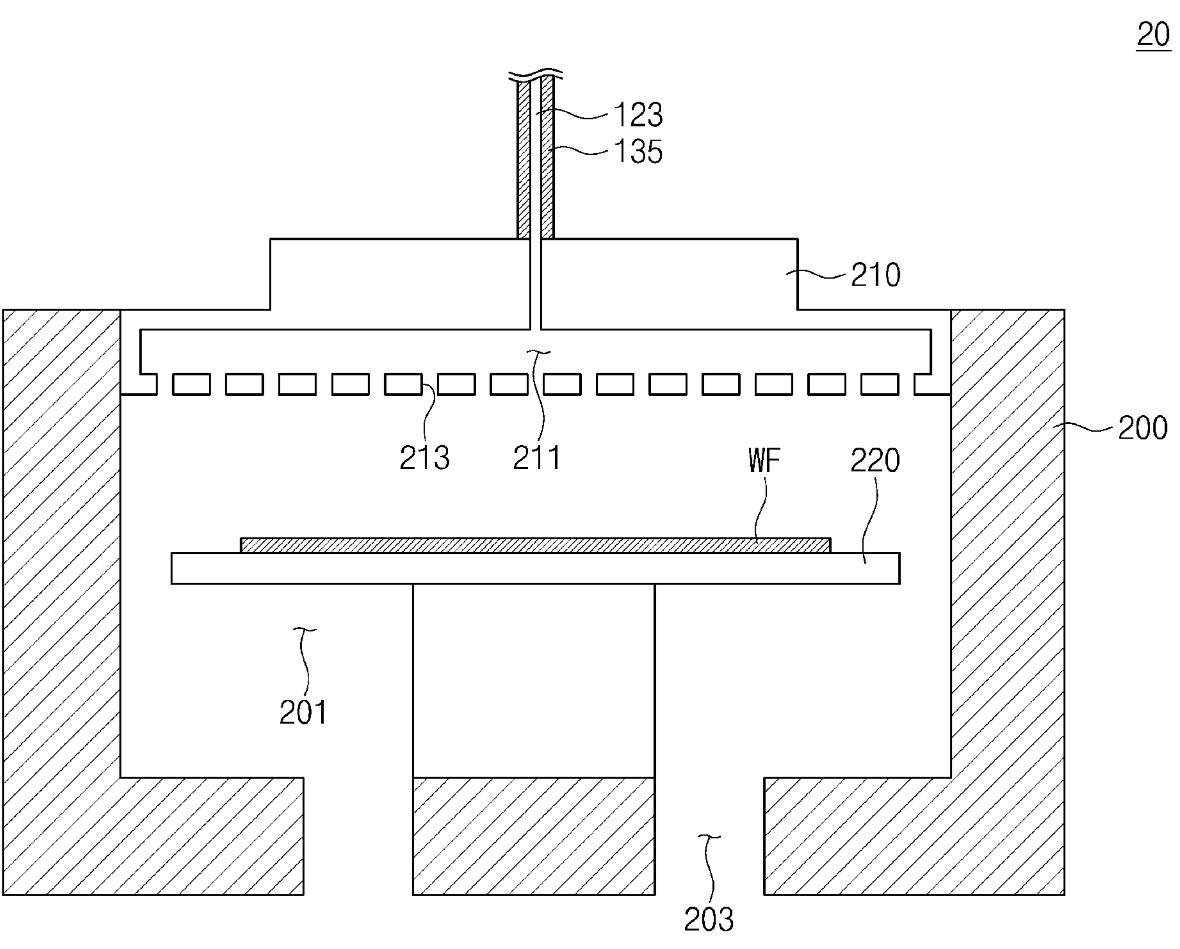
FIG. 3 is a sectional view illustrating a process chamber in a semiconductor manufacturing apparatus, according to an embodiment of the present disclosure.

FIG. 3 is a sectional view illustrating a process chamber in a semiconductor manufacturing apparatus, according to an embodiment of the present disclosure.

Referring to FIG. 3, the semiconductor manufacturing apparatus may include the process chamber 20. The process chamber 20 may include a chamber wall 200, a shower head 210, and a substrate fastening device 220. The second gas line 123 of the gas supplying part 10 may be connected to the process chamber 20 through the shower head 210.

The chamber wall 200 may include a bottom portion and a sidewall portion, which is vertically extended from an edge of the bottom portion. The chamber wall 200 may have an internal space 201, which is defined by the bottom portion and the sidewall portion. A substrate WF and the substrate fastening device 220 may be disposed in the internal space 201. In an embodiment, a semiconductor manufacturing process may be performed in the internal space 201. An exhausting pathway 203 may be provided in the bottom surface of the chamber wall 200. The exhausting pathway 203 may be connected to the exhausting device 30. The reaction gas and the by-product, which are left in the internal space 201 of the chamber wall 200, may be transferred to the exhausting device 30 through the exhausting pathway 203. The temperature of the chamber wall 200 may be controlled by a heating line and/or a cooling water. In an embodiment, the semiconductor manufacturing process may be performed under a high-temperature condition.

The shower head 210 may be placed in an upper portion of the chamber wall 200. The shower head 210 may be provided to have a waiting space 211 and a plurality of holes 213. The reaction gas may be provided into the waiting space 211 of the shower head 210 through the second gas line 123. The reaction gas in the waiting space 211 may be transferred to the internal space 201 of the process chamber 20 through the plurality of holes 213. When viewed in a plan view, the holes 213 may be spaced apart from each other by a constant distance. Thus, the reaction gas may be uniformly supplied into the internal space 201. Consequently, it may be possible to improve a process uniformity in a semiconductor manufacturing process that is performed on the substrate WF.

The substrate fastening device 220 may be located in the internal space 201 of the chamber wall 200. The substrate WF may be placed on the substrate fastening device 220. The substrate fastening device 220 may be configured to fasten the substrate WF. Alternatively or additionally, the substrate fastening device 220 may be configured to heat the substrate WF. For example, the substrate fastening device 220 may include an electrostatic chuck and/or a vacuum chuck.

Figure 4:
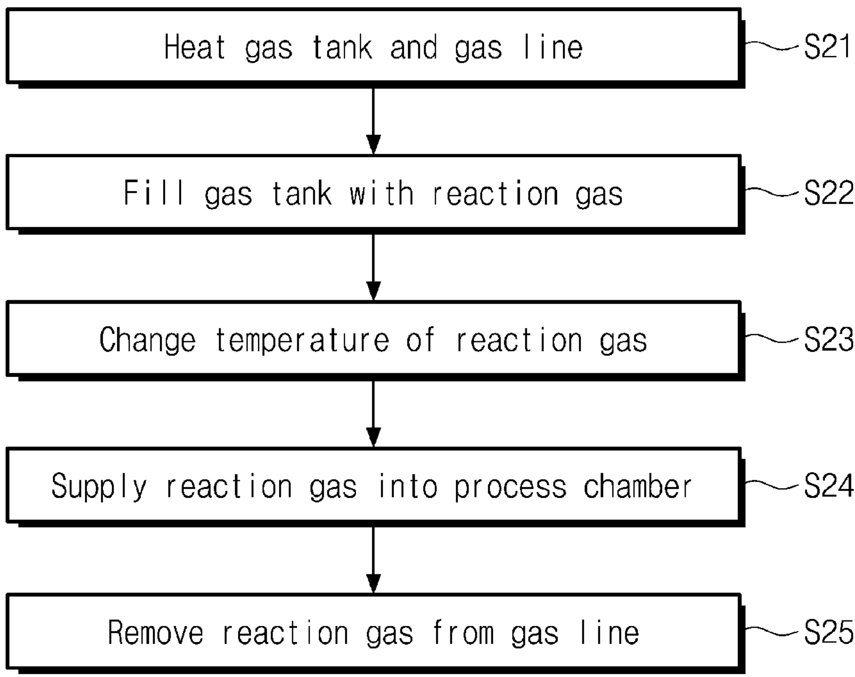
FIG. 4 is a flow chart illustrating a method of supplying a process gas in a semiconductor manufacturing process, according to an embodiment of the present disclosure.

FIG. 4 is a flow chart illustrating a method of supplying a process gas in a semiconductor manufacturing process, according to an embodiment of the present disclosure.

In the following description, an element previously described with reference to FIG. 1 may be identified by the same reference number without repeating an overlapping description thereof, for convenience in description.

Referring to FIGS. 1 and 4, a method of supplying a process gas in a semiconductor manufacturing process may include heating a gas tank and a gas line (operation S21), filling the gas tank with a reaction gas (operation S22), changing a temperature of the reaction gas (operation S23), supplying the reaction gas into a process chamber (operation S24), and removing the reaction gas from the gas line (operation S25).

In an embodiment, the heating of the gas tank and the gas lines (e.g., in operation S21) may be performed by the first to third heating devices 131, 133, and 135 and the temperature control device 140. Alternatively or additionally, the gas line may include the first and second gas lines 121 and 123.

For example, desired temperature ranges of the first to third heating devices 131, 133, and 135 may be input to the temperature control device 140 by a user. Alternatively or additionally, the desired temperature ranges of the first to third heating devices 131, 133, and 135 may be predefined. Temperature data, which may be measured by a temperature sensor in each of the first to third heating devices 131, 133, and 135, and/or may be sent to the temperature control device 140. If the temperature data measured by the first to third heating devices 131, 133, and 135 are lower than the desired temperature ranges, the gas tank 110 and/or the first and second gas lines 121 and 123 may be heated using the first to third heating devices 131, 133, and 135 by an electric power that may be supplied under the control of the temperature control device 140. If the temperature data measured by the first to third heating devices 131, 133, and 135 are greater than or equal to the desired temperature ranges, the temperature control device 140 may interrupt and/or reduce the supply of the electric power to the first to third heating devices 131, 133, and 135 to maintain the temperature of each of the gas tank 110 and the first and second gas lines 121 and 123 within the desired temperature ranges.

For example, the desired temperatures ranges of the first to third heating devices 131, 133, and 135 may range from approximately 100° C. to approximately 200° C. Thus, the temperature of the reaction gas in the first gas line 121 may range from about 40° C. to 60° C. Alternatively or additionally, the temperature of the reaction gas in the gas tank 110 and the second gas line 123 may range from about 80° C. to 120° C.

The filling of the gas tank with the reaction gas (in operation S22) may include closing the first gas valve 161 and increasing an internal pressure of the gas tank 110. The first gas valve 161 may be closed by the valve control device 150. As a result of the first gas valve 161 being closed, the reaction gas may be prevented from moving to the second gas line 123. Thus, the reaction gas may not flow into the second gas line 123 and may fill the gas tank 110.

The reaction gas may be moved from the flow control device 120 to the gas tank 110 through the first gas line 121. The flow control device 120 may be configured to control an amount of the reaction gas, which is supplied into the gas tank 110. The reaction gas may be continuously supplied into the gas tank 110, until the internal pressure of the gas tank 110 reaches a specific pressure value. In an embodiment, the specific pressure value may be input by a user. Alternatively or additionally, the specific pressure value may be predetermined. The internal pressure of the gas tank 110 may be increased by the supplying of the reaction gas. That is, the filling of the gas tank 110 with the reaction gas may include increasing the internal pressure of the gas tank 110. Thus, an internal pressure of the gas tank 110 may be higher (e.g., greater) than pressures in the first and second gas lines 121 and 123.

For example, an amount of the reaction gas passing through the flow control device 120 may range from approximately 2,000 standard cubic centimeters per minute (sccm) to approximately 4,000 sccm. The time, which may be taken to fill the gas tank 110 with the reaction gas, may be approximately eight (8) seconds to 13 seconds. As a result, an internal pressure of the gas tank 110 may range from approximately 600 Torr to approximately 1,000 Torr.

The changing of the temperature of the reaction gas (in operation S23) may include changing a pressure of the reaction gas to naturally decompose the reaction gas. For example, the gas tank 110 may be maintained to a high-temperature state by the second heating device 133. Thus, the temperature of the reaction gas in the gas tank 110 may be increased. A relationship between a temperature and a pressure of a gaseous material may be expressed by the following equation 1.

$$\left(P+\frac{a}{V_m^2}\right)(V_m-b)=RT,\ V_m=\frac{V}{n} \qquad \text{[Equation 1]}$$

Referring to equation 1, P, V, and T may represent volume, pressure, and temperature of the gas, respectively. R may represent the gas constant (e.g., R≈8.3145 J/(K·mol)), n may represent the number of moles of the gas, and a and b may be correction factors for the gas.

According to the equation 1, the pressure of the gas may be proportional to the temperature of the gas and the number of moles of the gas. That is, at the same gas pressure, the temperature of the gas and the number of moles of the gas may have an inversely proportional relationship. In other words, if the temperature of the reaction gas in the gas tank 110 is increased, the pressure may be increased. That is, if the temperature of the reaction gas is increased, an amount of the reaction gas required for the same pressure may be decreased. Thus, the higher the temperature of the reaction gas, the smaller the amount of the reaction gas needed to realize the internal pressure of the gas tank 110 required by a user (e.g., the specific pressure value). Accordingly, an amount of the reaction gas may be reduced.

The reaction gas may include first and second atoms. The reaction gas may include a material, which can be naturally decomposed. For example, a portion of a material included in the reaction gas may be decomposed depending on time and temperature. In an embodiment, the reaction gas may include a material whose natural decomposition rate increases as the temperature increases.

In an embodiment, the reaction gas may be borane, which is a chemical compound containing boron and hydrogen, and preferably, diborane ($B_2H_6$). In this case, the reaction gas may be naturally decomposed through at least one reaction process described by the following reaction formulas 1 and 2.

$$2B_2H_6 \rightarrow BH_3 + B_3H_9 \qquad \text{[Reaction Formula 1]}$$
$$B_3H_9 \rightarrow B_3H_7 + H_2$$

$$B_2H_6 + B_3H_7 \rightarrow B_4H_{10} + BH_3 \qquad \text{[Reaction Formula 2]}$$
$$B_4H_{10} \rightarrow B_4H_8 + H_2$$
$$B_4H_{10} + B_3H_7 \leftrightarrow B_7H_{17}$$
$$B_7H_{17} \leftrightarrow B_7H_{15} + H_2$$
$$B_7H_{15} \rightarrow B_4H_8 + B_3H_7$$
$$B_4H_{10} + B_4H_8 \rightarrow B_3H_7 + B_5H_{11}$$

The reaction formula 1 may represent the natural decomposition of diborane ($B_2H_6$) at room temperature. The reaction formula 2 may represent the natural decomposition of diborane ($B_2H_6$) at a high temperature. The reactions, which are described by the reaction formulas 1 and 2, may be endothermic reactions. As a result, the natural decomposition of $B_2H_6$ may be expedited at high temperature. That is, the natural decomposition of diborane ($B_2H_6$) may lead to a change in composition ratio of boron and hydrogen, and higher borane containing more boron atoms may be formed.

According to an embodiment of the present disclosure, the gas tank 110 and the first and second gas lines 121 and 123 may be maintained to high-temperature states by the first to third heating devices 131, 133, and 135. Thus, in the gas tank 110 and the first and second gas lines 121 and 123, the diborane ($B_2H_6$) may be naturally decomposed to, for example, $B_3H_9$, $B_4H_{10}$, and $B_5H_{11}$ according to the reaction formulas 1 and 2. The chemical structures of $B_2H_6$, $B_3H_9$, $B_4H_{10}$, and $B_5H_{11}$ may be represented by the following chemical formulas 1 to 4, respectively.

[Chemical Formula 1]

[Chemical Formula 2]

[Chemical Formula 3]

[Chemical Formula 4]

According to the chemical formulas 1 to 4, $B_3H_9$, $B_4H_{10}$, and $B_5H_{11}$ may correspond to a cyclic structure, unlike the diborane ($B_2H_6$). In particular, $B_4H_{10}$ may correspond to a planar structure.

Continuing to refer to FIG. 4, the supplying of the reaction gas into the process chamber 20 (in operation S24) may include opening the first gas valve 161, closing the second gas valve 163, and lowering the internal pressure of the gas tank 110. The opening of the first gas valve 161 and the closing of the second gas valve 163 may be controlled by the valve control device 150. As a result of the first gas valve 161 being opened, the reaction gas may be supplied into the process chamber 20 through the second gas line 123. Alternatively or additionally, as a result of the second gas valve 163 being closed, the reaction gas may be prevented from moving to the gas exhausting line 125.

As a result of the internal pressure of the gas tank 110 being higher than the pressure of the first and second gas lines 121 and 123, the reaction gas may be quickly supplied into the process chamber through the second gas line 123. Alternatively or additionally, as the reaction gas in the gas tank 110 is drained from the gas tank 110, the internal pressure of the gas tank 110 may be lowered. That is, the supplying of the reaction gas into the process chamber 20 may include lowering the internal pressure of the gas tank 110. In such a case, the reaction gas may be further supplied into the gas tank 110 through the first gas line 121. However, the present disclosure is not limited in this regard.

In an embodiment, the time it takes to supply the reaction gas into the process chamber 20 may be shorter than the time it takes to fill the gas tank 110 with the reaction gas. That is, it may be possible to supply a large amount of the reaction gas into the process chamber 20 at high pressure for a short time. Accordingly, the reaction gas may be uniformly supplied to a surface of a semiconductor device including a structure of high aspect ratio. As a result, it may be possible to improve process uniformity in the manufacturing process. For example, the reaction gas may be supplied into the process chamber 20 in approximately one (1) second to five (5) seconds.

The removing of the reaction gas from the gas line (in operation S25) may include closing the first gas valve 161 and opening the second gas valve 163. If the process step of supplying the reaction gas is finished, the first gas valve 161 may be closed by the valve control device 150. Thus, it may be possible to prevent the reaction gas in the gas tank 110 from being supplied into the process chamber 20 through the second gas line 123.

Thereafter, the second gas valve 163 may be opened by the valve control device 150. The reaction gas in the second gas line 123 may be transferred to the exhausting device 30 through the gas exhausting line 125. Accordingly, the reaction gas may be removed from the second gas line 123. After the removing of the reaction gas from the second gas line 123, the second gas valve 163 may be closed by the valve control device 150.

Alternatively or additionally, the closing of the first gas valve 161 and the opening of the second gas valve 163 may be executed at substantially the same time (e.g., simultaneously).

In an embodiment, a method of supplying a process gas in a semiconductor manufacturing process may further include supplying a carrier gas into the process chamber 20, as described above with reference to FIG. 2. The supplying of the carrier gas into the process chamber 20 may include mixing the carrier gas and the reaction gas.

Referring to FIG. 2, the carrier gas may be transferred from the second flow control device 120*b* to the second gas line 123 through the third gas line 127. In the second gas line 123, the carrier gas may be mixed with the reaction gas to form a mixture gas. That is, the carrier gas and the reaction gas may be mixed outside the process chamber 20 and then may be supplied into the process chamber 20.

For example, the carrier gas may be an inert gas. In an embodiment, the inert gas may contain, but not be limited to, argon (Ar) and/or nitrogen ($N_2$). The supplying of the carrier gas into the process chamber 20 may be executed simultaneously (e.g., substantially the same time) during the supplying of the reaction gas into the process chamber 20.

Figure 5:
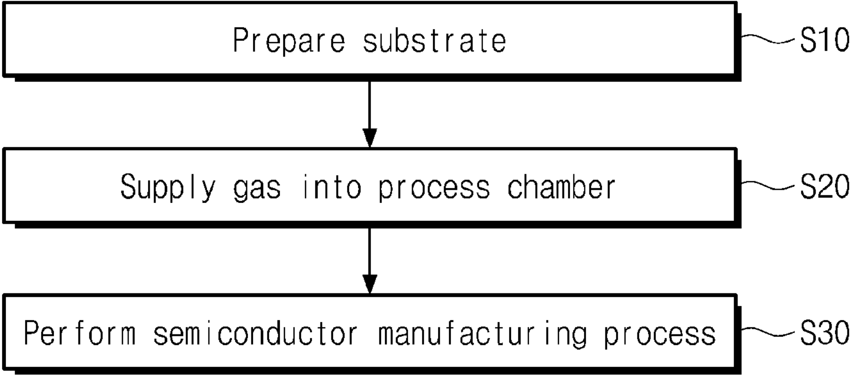
FIG. 5 is a flow chart illustrating a method of manufacturing a semiconductor device, according to an embodiment of the present disclosure.

FIG. 5 is a flow chart illustrating a method of manufacturing a semiconductor device. The method of supplying a process gas in a semiconductor manufacturing process, according to an embodiment of the present disclosure, may be used in the manufacturing method of FIG. 5.

Referring to FIGS. 3 and 5, a method of manufacturing a semiconductor device may include preparing a substrate (operation S10), supplying a gas into a process chamber (operation S20), and performing a semiconductor manufacturing process (operation S30). The preparing of the substrate (operation S10) may include placing the substrate WF on the substrate fastening device 220 of the process chamber 20 and fastening the substrate WF. The fastening of the substrate WF may be performed by the substrate fastening device 220.

The supplying of the gas into the process chamber (in operation S20) may include supplying the process gas in a semiconductor manufacturing process as described above with reference to FIG. 4. The reaction gas may be uniformly supplied into the internal space 201 of the process chamber 20 through the holes 213 of the shower head 210.

In an embodiment, the heating of the gas tank and the gas lines (in operation S21) may be performed before the supplying of the gas into the process chamber (in operation S20). That is, the heating of the gas tank and the gas line (in operation S21) may be performed before or during the preparing of the substrate (in operation S10).

In another embodiment, the steps of filling the gas tank with the reaction gas (in operation S22), changing the temperature of the reaction gas (in operation S23), supplying the reaction gas into the process chamber (in operation S24), and removing the reaction gas from the gas line (in operation S25) may be repeatedly performed. That is, the gas may be supplied into the process chamber 20 in a pulsed shape.

In other embodiment, at least two different reaction gases of different kinds may be supplied into the process chamber 20. For example, the gas supplying part 10 may include first and second gas supplying parts, and the reaction gas may include first and second reaction gases. The first and second reaction gases may include different materials from each other. The first and second reaction gases may be supplied into the process chamber 20 with a specific time lag. That is, the first and second reaction gases may not be supplied simultaneously.

The semiconductor manufacturing process (in operation S30) may be performed in the process chamber 20. The semiconductor manufacturing process may include, but not be limited to, a CVD process and/or an ALD process, which may be performed using the reaction gas. For example, a new layer may be deposited on the substrate WF. The semiconductor manufacturing process (in operation S30) is described in more detail with reference to FIGS. 6 to 11.

FIGS. 6 to 11 are sectional views illustrating a method of manufacturing a semiconductor device. The method of supplying a process gas in a semiconductor manufacturing process, according to an embodiment of the present disclosure, may be used in the manufacturing method of FIGS. 6 to 11.

Figure 6:
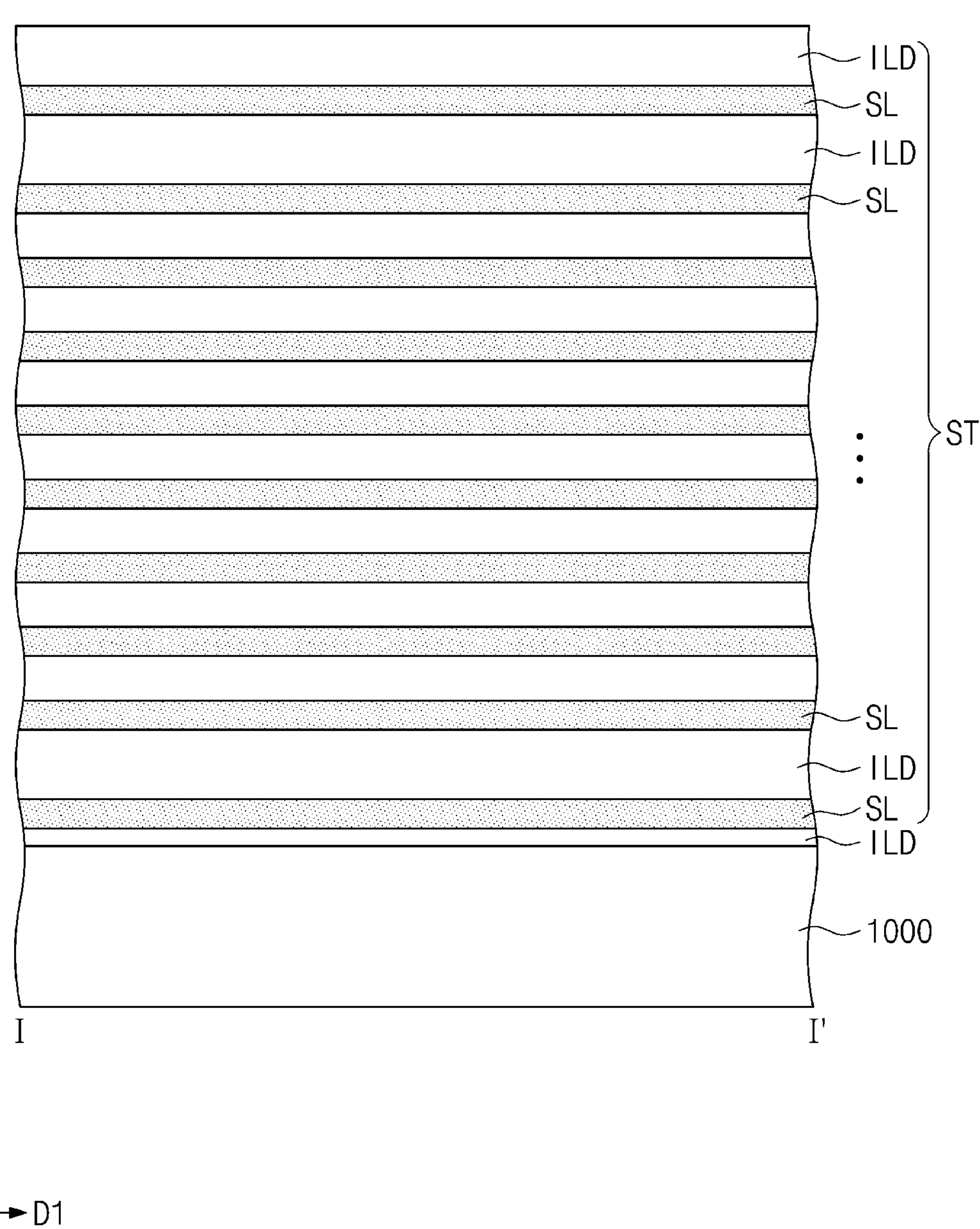
FIGS. 6 to 11 are sectional views illustrating a method of manufacturing a semiconductor device, according to an embodiment of the present disclosure.

Referring to FIG. 6, the semiconductor device may be, for example, a semiconductor memory device, such as, but not limited to, a three-dimensional semiconductor memory device. Interlayer insulating layers ILD and sacrificial layers SL may be formed on a substrate 1000. The interlayer insulating layers ILD and the sacrificial layers SL may be alternately stacked in a second direction D2 perpendicular to a top surface of the substrate 1000 to form a stack ST. The interlayer insulating layers ILD and the sacrificial layers SL may be formed by, for example, a CVD process.

The sacrificial layers SL of the stack ST may be formed of and/or include a material that has an etch selectivity with respect to the interlayer insulating layers ILD. For example, the sacrificial layers SL may be formed of and/or include silicon nitride ($Si_3N_4$), and the interlayer insulating layers ILD may be formed of and/or include silicon oxide ($SiO_2$). However, the present disclosure is not limited in this regard. That is, the sacrificial layers SL and the interlayer insulating layers ILD may be formed of and/or include other materials without departing from the scope of the present disclosure.

The lowermost one of the interlayer insulating layers ILD may be formed between the lowermost one of the sacrificial layers SL and the substrate 1000 and may have a thickness, which may be thinner than the others of the interlayer insulating layers ILD, in the second direction D2. For example, the lowermost one of the interlayer insulating layers ILD may be formed by a thermal oxidation process, which may be performed after the deposition process.

Figure 7:
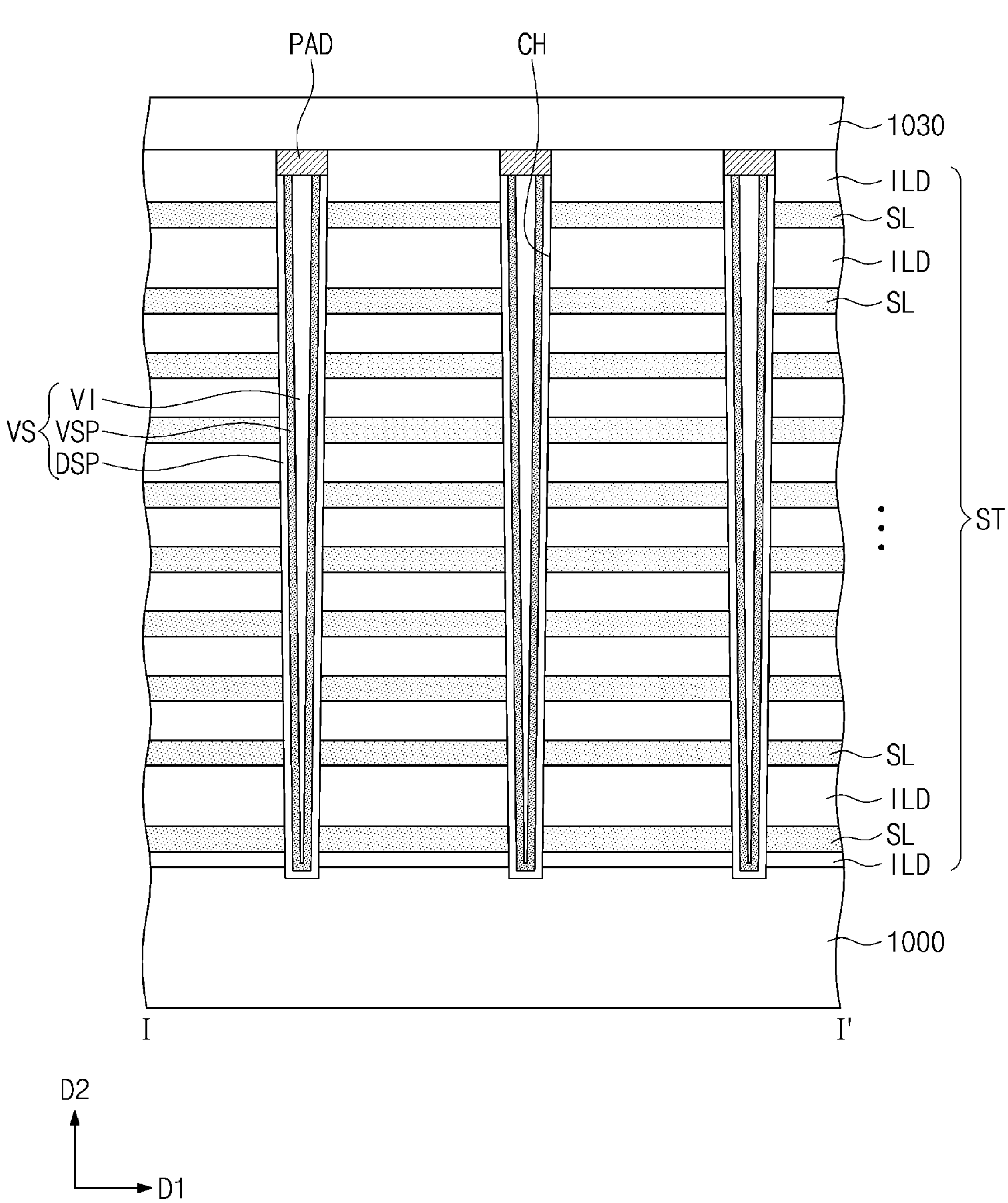

Referring to FIG. 7, channel holes CH may be formed to penetrate the interlayer insulating layers ILD and the sacrificial layers SL of the stack ST. The channel holes CH may be formed to expose side surfaces of the interlayer insulating layers ILD and the sacrificial layers SL. In an embodiment, the channel holes CH may be formed to recess portions of the substrate 1000 and to partially expose the top surface of the substrate 1000.

The formation of the channel holes CH may include forming a mask pattern on the stack ST and performing an etching process using a mask pattern as an etch mask. The top surface of the substrate 1000 may be over-etched by the etching process. For example, the etching process may be a dry etching process, which may be performed using plasma.

Vertical structures VS, each of which includes a data storage pattern DSP, a vertical semiconductor pattern VSP, and a gapfill insulating pattern VI, may be formed in the channel holes CH, respectively. The data storage pattern DSP may be formed on a side surface of the channel hole CH. The vertical semiconductor pattern VSP may be conformally deposited on the data storage pattern DSP by a chemical vapor deposition method or atomic layer deposition method. The data storage pattern DSP and the vertical semiconductor pattern VSP may have, for example, a shape that may be similar to a pipe and/or a macaroni shape with a closed bottom.

The gapfill insulating pattern VI may be provided to fill an empty space, which may be enclosed by the data storage pattern DSP and the vertical semiconductor pattern VSP. The gapfill insulating pattern VI may be formed by filling an internal space of each channel hole CH, which may be enclosed by the vertical semiconductor pattern VSP, with an insulating material and performing a planarization process to expose a top surface of the stack ST.

A conductive pad PAD may be formed on a top surface of each of the vertical structures VS. The conductive pad PAD may be formed by partially recessing the vertical structures VS and filling the recessed regions with a doped semiconductor material and/or a conductive material.

An upper insulating layer 1030 may be formed on the uppermost one of the interlayer insulating layers ILD and the conductive pad PAD. The upper insulating layer 1030 may cover the stack ST and the conductive pad PAD. In an embodiment, the upper insulating layer 1030 may be formed of and/or include, but not be limited to, at least one of silicon nitride ($Si_3N_4$), silicon oxide ($SiO_2$), or silicon oxynitride (e.g., $SiN_xO_y$).

Figure 8:
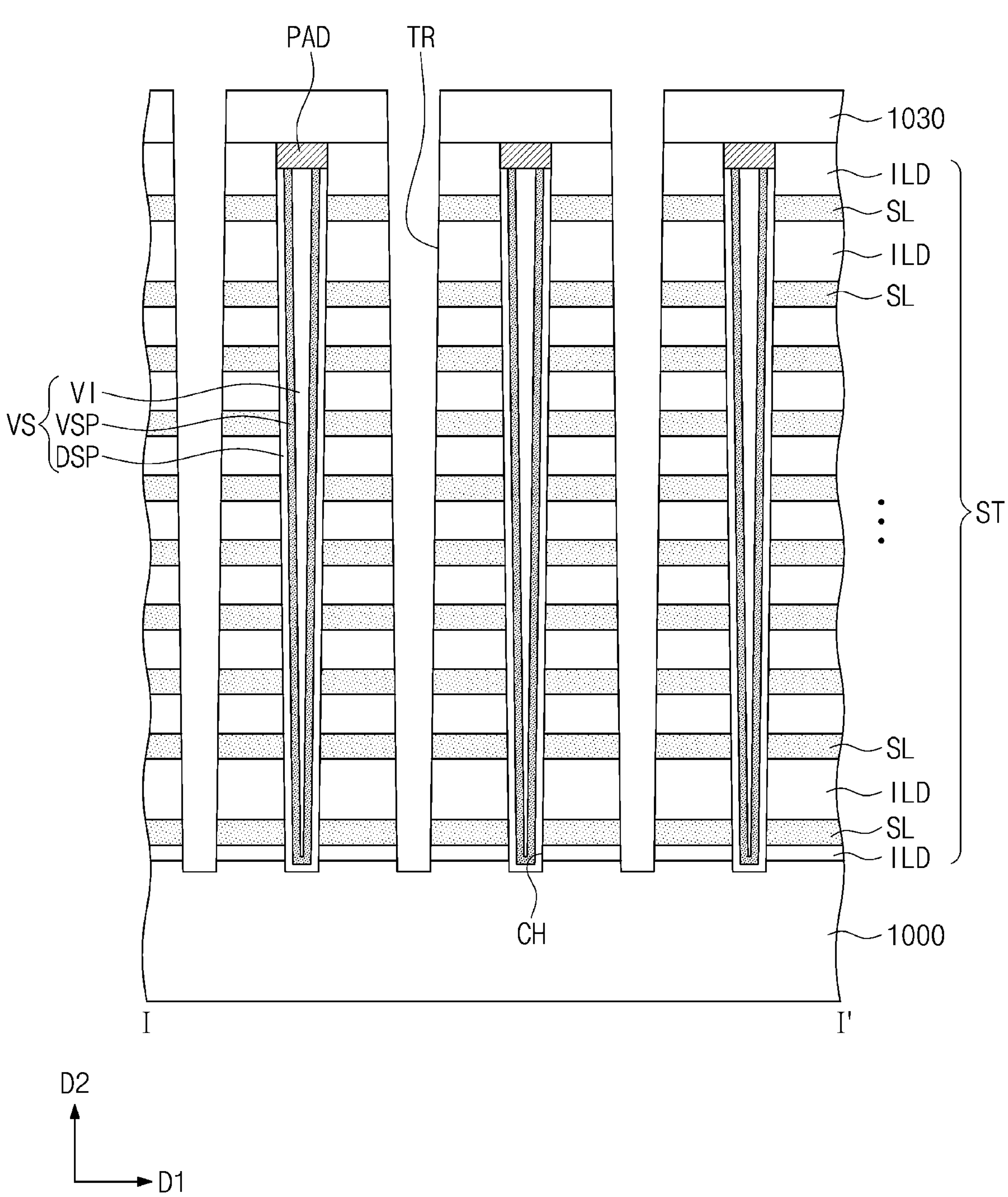

Referring to FIG. 8, an isolation trench TR may be formed to penetrate the upper insulating layer 1030 and the stack ST. The isolation trench TR may be formed to expose the top surface of the substrate 1000 and recess a portion of the substrate 1000. The isolation trench TR may also be formed to expose the side surfaces of the interlayer insulating layers ILD and the sacrificial layers SL.

The isolation trench TR may be formed by forming a mask pattern on the upper insulating layer 1030 and performing a patterning process using the mask pattern as an etch mask. In an embodiment, the top surface of the substrate 1000 may be over-etched by the patterning process. The isolation trench TR may be spaced apart from the vertical structures VS in a first direction D1.

Figure 9:
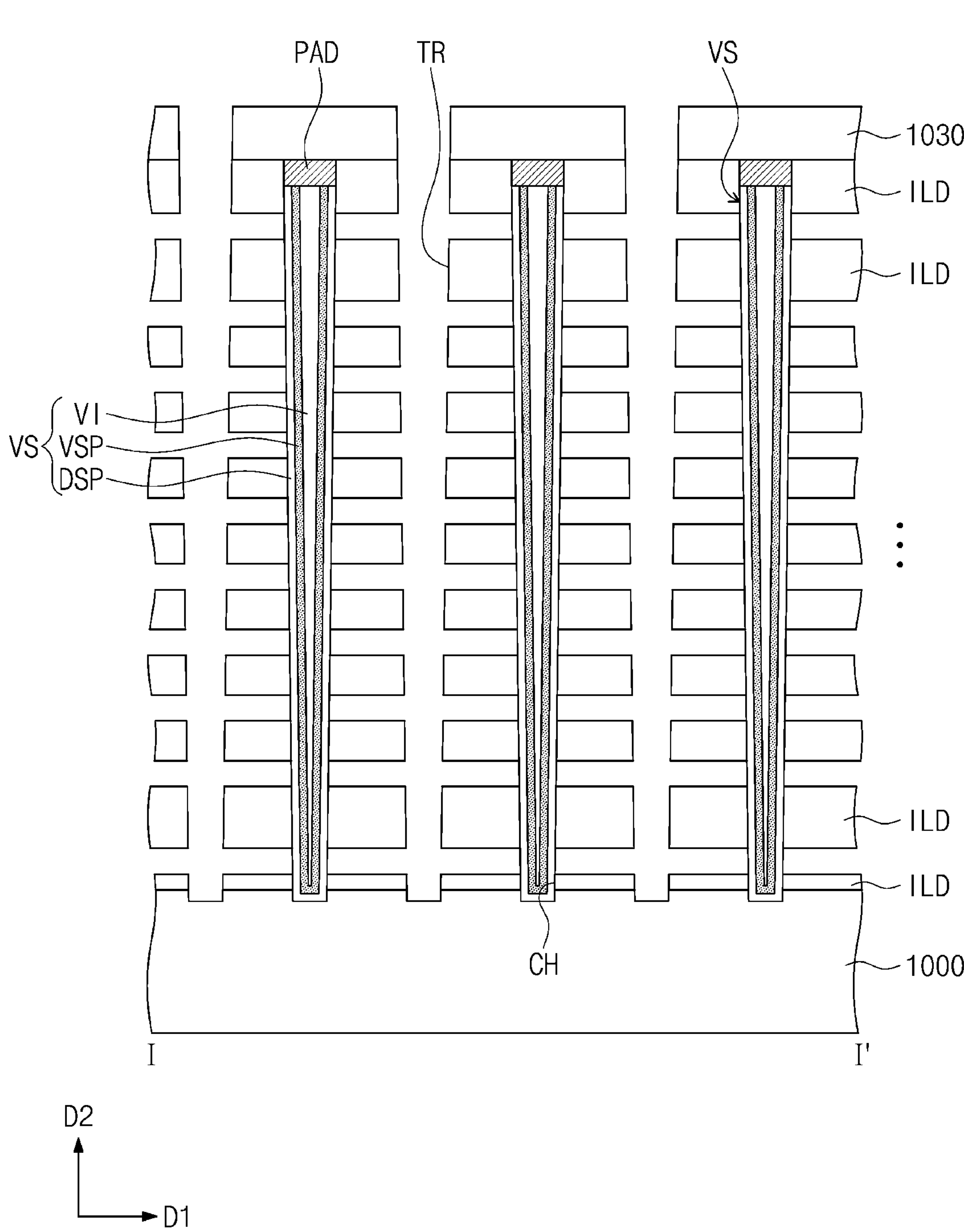

Referring to FIG. 9, the sacrificial layers SL exposed by the isolation trench TR may be selectively removed. The selective removal of the sacrificial layers SL may be performed by a wet etching process using etching solution. For example, the sacrificial layers SL may be selectively removed using etching solution containing hydrofluoric acid (HF) or phosphoric acid ($H_3PO_4$).

The removal of the sacrificial layers SL may be performed to expose portions of side surfaces of the vertical structures VS and top and bottom surfaces of the interlayer insulating layers ILD. Although the sacrificial layers SL may be removed, the interlayer insulating layers ILD may be fastened by the vertical structures VS and may not be deformed.

Figure 10:
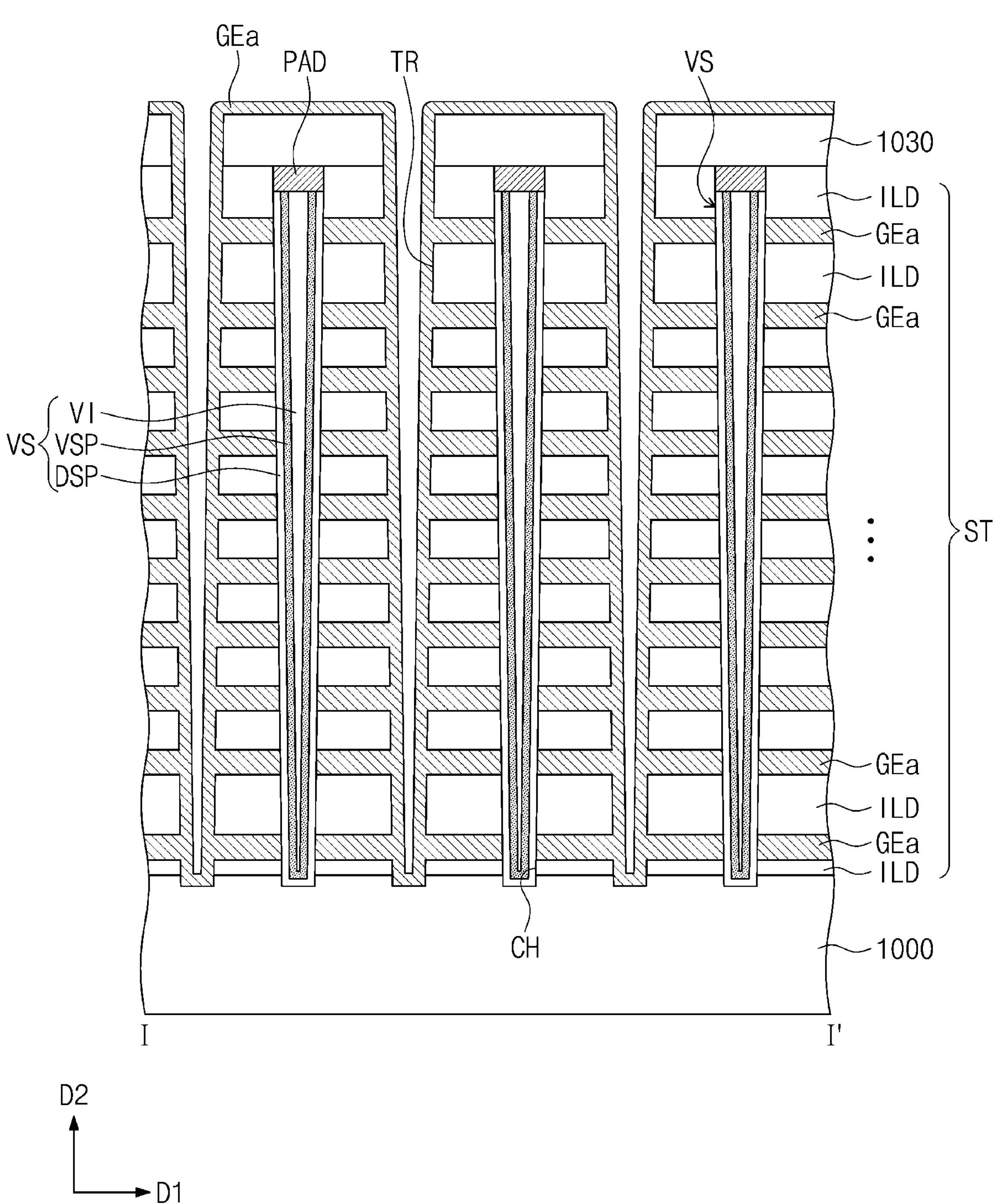

Referring to FIG. 10, a conductive layer GEa may be formed to fill spaces, which may be formed by removing the sacrificial layers SL, and to cover the isolation trench TR and a top surface of the upper insulating layer 1030. The formation of the conductive layer GEa may include forming a TiN layer and forming a tungsten layer. That is, the conductive layer GEa may include the TiN layer and the tungsten layer.

The TiN layer may be formed to uniformly cover an inner space of the isolation trench TR, the top surface of the upper insulating layer 1030, and exposed surfaces of the interlayer insulating layers ILD. The TiN layer may be formed by one of a physical vapor deposition (PVD) process, a CVD process, or an ALD process. The TiN layer may prevent a reaction gas from being diffused, as further described below.

The tungsten layer may be formed on the TiN layer using a reaction gas. The reaction gas may include a reduction gas and a tungsten source gas. In an embodiment, the tungsten layer may be formed by the semiconductor manufacturing method described with reference to FIG. 5. The reaction gas may be supplied into the process chamber using the gas supplying method described with reference to FIG. 4.

For example, the reduction gas may be diborane ($B_2H_6$), and the tungsten source gas may be tungsten hexafluoride ($WF_6$). In this case, the reduction gas may be adsorbed on the TiN layer and then may be reacted with the tungsten source gas to form a tungsten layer deposited on the TiN layer. That is, the reduction gas may be naturally decomposed in the gas tank and the first and second gas lines and then may be supplied into the process chamber, as described with reference to FIG. 4. As shown by the chemical formulas 2 to 4, the naturally-decomposed reduction gas may have a cyclic and/or planar structure. Consequently, the naturally-decomposed reduction gas may be easily absorbed on the TiN layer, compared with a reduction gas that is not naturally decomposed.

For example, in the case where the TiN layer has a (111) plane, the naturally-decomposed reduction gas may be more easily adsorbed on the TiN layer. As a result, a reaction with the tungsten source gas may be expedited. That is, when the naturally-decomposed reduction gas is used, it may be possible to uniformly adsorb the reduction gas on the TiN layer, even when an amount of the reduction gas is less than an amount of the reduction gas used when the naturally-decomposed reduction gas is not used, and still form the tungsten layer uniformly. Consequently, it may be possible to improve reactivity of the reduction gas and thereby to reduce an amount of the reduction gas used in the deposition process.

Figure 11:
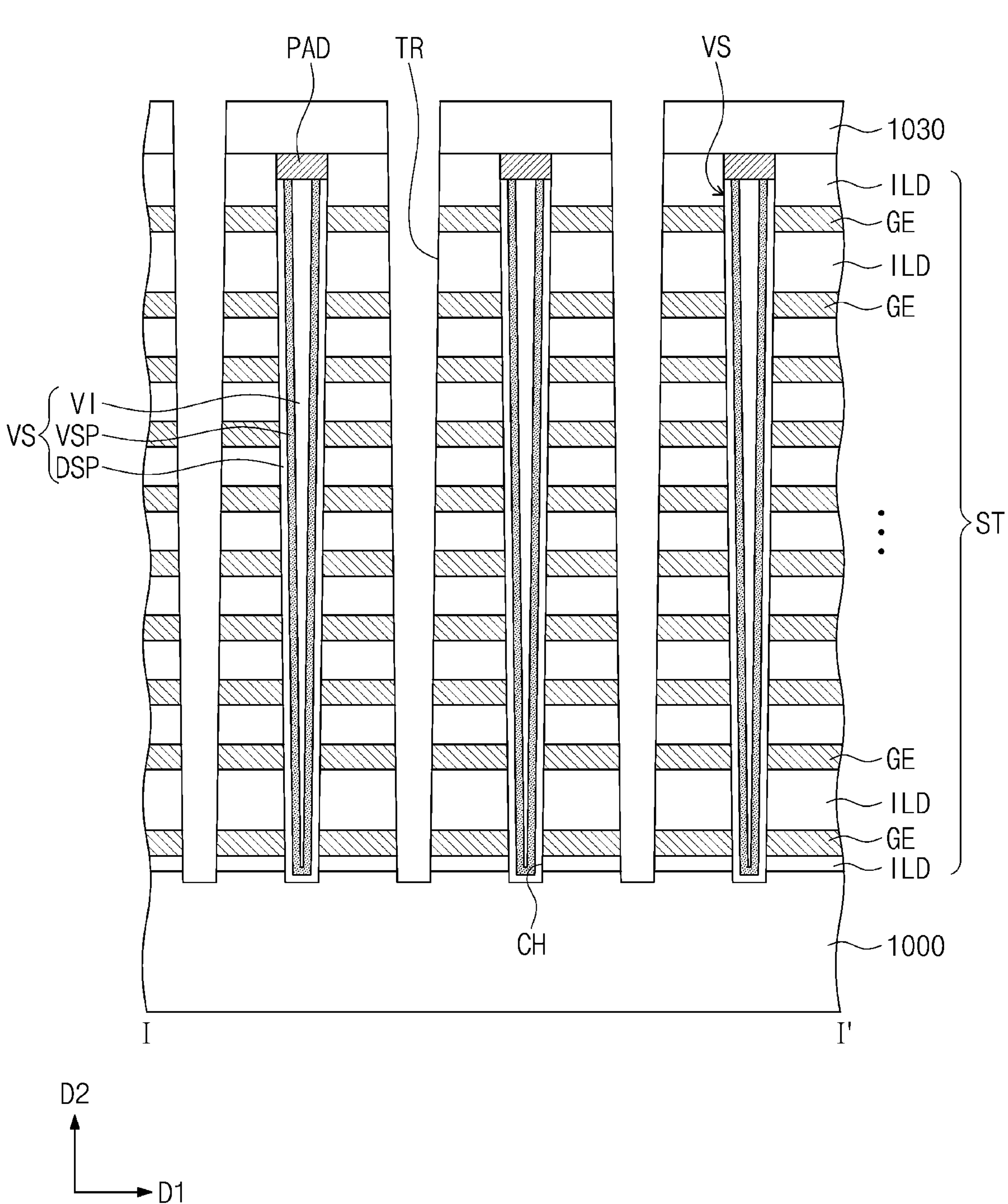

Referring to FIG. 11, the conductive layer GEa may be removed from the inner space of the isolation trench TR and from a region on the upper insulating layer 1030. The removal of the conductive layer GEa may be performed by an etching process. For example, the etching process may include, but not be limited to, a dry etching process, which may be performed using plasma.

Thus, the conductive layer GEa may form gate electrodes GE which may be separated from each other. As a result of the formation of the gate electrodes GE, stacks ST may be formed. Each of the stacks ST may include the gate electrodes GE and the interlayer insulating layers ILD, which may be alternately stacked in the second direction D2 perpendicular to the top surface of the substrate 1000. The stacks ST may be spaced apart from each other in the first direction D1.

As described above, in the semiconductor manufacturing apparatus, the method of supplying a process gas using the same in a semiconductor manufacturing process, and the method of manufacturing a semiconductor device using the same, the reaction gas in the gas line and the gas tank may be heated. As a result, it may be possible to expedite the natural decomposition of the reaction gas and thereby to improve the reactivity of the reaction gas. Alternatively or additionally, when an amount of the reaction gas is reduced, it may be possible to achieve a desired pressure of the gas tank. And thus, it may be possible to reduce an amount of the reaction gas used in a semiconductor manufacturing process.

While example embodiments of the present disclosure have been particularly shown and described, it is to be understood by one of ordinary skill in the art that variations in form and detail may be made therein without departing from the spirit and scope of the attached claims.

What is claimed is:

1. A method of supplying a process gas in a semiconductor manufacturing process by a semiconductor manufacturing apparatus, comprising:

heating, using one or more heating devices of the semiconductor manufacturing apparatus, a gas tank and a gas line of the semiconductor manufacturing apparatus;

filling, through the gas line, the gas tank with a reaction gas comprising diborane ($B_2H_6$);

changing, using the one or more heating devices, a temperature of the reaction gas in the gas tank; and supplying the reaction gas from the gas tank to a process chamber of the semiconductor manufacturing apparatus, wherein the changing of the temperature of the reaction gas comprises decomposing a portion of the diborane to at least one of $B_3H_9$, $B_4H_{10}$, and $B_5H_{11}$.

2. The method of claim 1, wherein the filling of the gas tank with the reaction gas comprises increasing a pressure of the reaction gas in the gas tank.

3. The method of claim 1, wherein the supplying of the reaction gas to the process chamber comprises lowering a pressure of the reaction gas in the gas tank.

4. The method of claim 1, further comprising:

measuring, using a measurement device of the gas tank, a pressure of the reaction gas and the temperature of the reaction gas in the gas tank; and operating, using a valve control device, a gas valve on the gas line, based on the pressure of the reaction gas and the temperature of the reaction gas.

5. The method of claim 1, wherein:

the filling of the gas tank comprises filling, through the gas line, the gas tank with the reaction gas for a first time length, the supplying of the reaction gas comprises supplying the reaction gas from the gas tank to the process chamber for a second time length, the second time length is shorter than the first time length.

6. The method of claim 1, further comprising:

supplying a carrier gas to the process chamber, wherein the supplying of the carrier gas comprises mixing the carrier gas with the reaction gas outside of the process chamber.

7. The method of claim 1, wherein the heating of the gas tank and the gas line comprises:

heating, using the one or more heating devices and a temperature control device, the gas tank and the gas line.

8. The method of claim 1, wherein:

the reaction gas comprises first atoms and second atoms, the first atoms comprise boron, and
the second atoms comprise hydrogen.

9. A method of manufacturing a semiconductor device by a semiconductor manufacturing apparatus, comprising:
heating, using one or more heating devices of the semiconductor manufacturing apparatus, a gas tank and a gas line of the semiconductor manufacturing apparatus;
preparing a substrate to a process chamber of the semiconductor manufacturing apparatus;
supplying a reaction gas to the process chamber; and
performing a semiconductor manufacturing process in the process chamber,
wherein the supplying of the reaction gas comprises:
filling, through the gas line, the gas tank with the reaction gas;
changing, using the one or more heating devices, a temperature of the reaction gas in the gas tank; and
supplying the reaction gas from the gas tank to the process chamber,
wherein a first time length for the filling of the gas tank with the reaction gas is larger than a second time length for the supplying of the reaction gas to the process chamber.

10. The method of claim 9, wherein performing of the semiconductor manufacturing process comprises:
performing at least one of a chemical vapor deposition process and an atomic layer deposition process on the substrate.

11. The method of claim 9, wherein the supplying of the reaction gas comprises repeatedly performing the supplying of the reaction gas to the process chamber.

12. The method of claim 9, wherein the supplying of the reaction gas comprises:
supplying, at a first timestamp, a first reaction gas to the process chamber; and
supplying, at a second timestamp, a second reaction gas to the process chamber,
wherein the first timestamp is different from the second timestamp.

13. The method of claim 9, wherein the reaction gas comprises at least one of $B_2H_6$, $BCl_3$, $SiH_4$, $SiH_2Cl_2$, and $H_2$.

14. The method of claim 9, wherein the changing of the temperature of the reaction gas in the gas tank comprises changing, using the one or more heating devices, the temperature of the reaction gas in the gas tank to be greater than or equal to 80° C. and less than or equal to 120° C.

* * * * *